United States Patent
Shim et al.

(10) Patent No.: US 7,336,702 B2
(45) Date of Patent: Feb. 26, 2008

(54) JITTER DETECTING APPARATUS AND PHASE LOCKED LOOP USING THE DETECTED JITTER

(75) Inventors: Jae-seong Shim, Seoul (KR); Hyun-soo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1305 days.

(21) Appl. No.: 09/872,155

(22) Filed: Jun. 4, 2001

(65) Prior Publication Data

US 2002/0021776 A1 Feb. 21, 2002

(30) Foreign Application Priority Data

Jul. 20, 2000 (KR) .............................. 2000-41743

(51) Int. Cl.
H04B 17/00 (2006.01)
H04L 7/00 (2006.01)

(52) U.S. Cl. .................... 375/226; 375/373; 375/376; 702/69

(58) Field of Classification Search ............... 375/371, 375/247, 340, 346, 376, 155, 226, 373; 341/155; 327/156, 160; 702/69; 713/503
See application file for complete search history.

(56) References Cited

U.S. PATENT DOCUMENTS

| | | | | |
|---|---|---|---|---|
| 4,598,310 A | * | 7/1986 | Brand et al. | 358/19 |
| 4,947,456 A | * | 8/1990 | Atkinson et al. | 455/165 |
| 5,315,618 A | * | 5/1994 | Yoshida | 375/94 |
| 5,717,469 A | * | 2/1998 | Jennes et al. | 348/571 |
| 5,790,543 A | * | 8/1998 | Cloutier | 370/395 |
| 5,841,323 A | | 11/1998 | Fujimoto | 331/11 |
| 5,872,819 A | | 2/1999 | Carsello et al. | 375/355 |
| 6,079,045 A | | 6/2000 | Van Den Enden | 714/780 |
| 6,249,180 B1 | * | 6/2001 | Maalej et al. | 329/304 |
| 6,256,003 B1 | * | 7/2001 | Tsuchiya et al. | 345/87 |
| 6,329,850 B1 | * | 12/2001 | Mair et al. | 327/107 |
| 6,459,733 B1 | * | 10/2002 | Yokoyama et al. | 375/240.12 |
| 6,606,360 B1 | * | 8/2003 | Dunning et al. | 375/354 |
| 6,631,103 B1 | * | 10/2003 | Yamanoi et al. | 369/47.17 |

(Continued)

Primary Examiner—Young T. Tse
(74) Attorney, Agent, or Firm—Stein, McEwen & Bui, LLP

(57) ABSTRACT

A jitter detecting circuit and a phase locked loop using the detected jitter are provided. A jitter detecting circuit detecting a jitter value of a signal which is converted into a digital signal from an analog signal input, wherein the jitter value detecting circuit includes an edge detector discriminating signs of two signals derived from continuous sampling points from the digitally converted input signal, and outputting the two signals as first and second edge signals, respectively if the signs s are different from each other; a comparator outputting a signal having a smaller absolute value among the first and second edge signals output from the edge detector; an operating unit dividing the absolute value output from the comparator by the sum of the absolute value of the first edge signal and that of the second edge signal; and an accumulator accumulating outputs of the operating unit during a predetermined period, to obtain a jitter value of the predetermined period. A jitter amount is detected with signals derived from two sampling points around the edge from the analog-digital converted signal, so that an accurate jitter amount can be detected regardless of the input signal amplitude, and an accurate and fast phase locked signal can be obtained using the jitter value.

7 Claims, 5 Drawing Sheets

U.S. PATENT DOCUMENTS 6,665,342 B1 * 12/2003 Brown et al. .......... 375/240.16
6,687,629 B1 * 2/2004 Yamaguchi et al. .......... 702/69
6,704,353 B1 * 3/2004 McCarty et al. ............ 375/227
6,763,060 B1 * 7/2004 Knapp ........................ 375/219

* cited by examiner

JITTER DETECTING APPARATUS AND PHASE LOCKED LOOP USING THE DETECTED JITTER

CROSS REFERENCE TO RELATED APPLICATION

This application claims the benefit of Korean Patent Application No. 00-41743 filed Jul. 20, 2000, in the Korean Industrial Property Office, the disclosure of which is incorporated herein by reference.

BACKGROUND OF THE INVENTION

1. Field of the Invention

The present invention relates to jitter detecting, and more particularly, to a method and an apparatus detecting a jitter amount using an analog-digital conversion circuit.

2. Description of the Related Art

Generally, in a technique to convert an analog signal into a digital signal, the analog signal is binarized through a comparator, and a phase locked loop is applied to the binarized signal to make a system clock. Data is processed using the binarized signal and the system clock. Here, a synchronism of the analog signal does not correspond accurately with that of the system clock, and a little phase difference exists, which is called a jitter.

As an analog method of detecting a jitter becomes generalized, a method of binarizing, using a converted digital signal after converting the analog signal into the digital signal through the analog-digital converting process, is used instead of binarizing the analog signal by directly using a comparator. Since the method of detecting a jitter used in the latter case detects a jitter value using a signal of one sampling point around the edge of the analog signal, the jitter value is not detected correctly if the analog signal is small or an error signal exists.

FIG. 1 is a block diagram of a general digital system including a jitter detecting circuit, wherein the system includes an A/D converter 100, a DC offset eliminator 110, a jitter detector 120, and a digital phase locked loop (PLL) circuit 130. The A/D converter 100 converts an analog input signal into a digital signal, and generates digital data corresponding to the digital signal. The DC offset eliminator 110 eliminates a direct current voltage offset from the digital data. The jitter detector 120 detects a jitter value from the offset-eliminated signal. The digital PLL circuit 130 generates a locked signal from the offset-eliminated signal, and the locked signal is generated as the system clock. As an example, Korean Patent P1998-0049210, published on Nov. 17, 1998, applied by the same inventor, discloses a method of calculating a jitter value from analog/digital converted digital data. However, in such a case, if an analog signal with small amplitude enters the system, the analog to digital converted value itself is small, and the jitter amount detected from the value is also small. In the case of an input signal having an error, in which the amplitude of the signal greatly varies, there can be an error in the operation of the circuit itself.

SUMMARY OF THE INVENTION

Accordingly, it is an object of the present invention to provide a jitter detector detecting a jitter amount from signals derived from two sampling points around the edge of an analog/digital converted signal.

It is a further object of the present invention to provide a phase locked loop circuit with the jitter amount detected in a signal and a phase locked loop using the detected jitter.

Additional objects and advantages of the invention will be set forth in part in the description which follows and, in part, will be obvious from the description, or may be learned by practice of the invention.

The foregoing objects of the present invention are achieved by providing a jitter value detecting circuit detecting a jitter value of a signal which is converted into a digital signal from an analog signal input, wherein the jitter value detecting circuit comprises: an edge detector discriminating signs of two signals derived from two continuous sampling points from the digitally converted input signal, and outputting the two signals as first and second edge signals, respectively, if the signs are different from each other; a comparator outputting a signal having a smaller absolute value among the first and second edge signals output from the edge detector; an operating unit dividing the absolute value output from the comparator by the sum of the absolute value of the first edge signal and that of the second edge signal, respectively; and an accumulator accumulating outputs of the operating unit during a predetermined period, to obtain a jitter value of the predetermined period.

According to an aspect of the present invention, the edge detector comprises a delayer delaying the digitally input signal by one system clock; and an edge generator comparing signs of an output signal of the delayer with signs of the digitally input signal, and outputting the two signals as the first edge signal and the second edge signal, respectively, if the compared signs are different with respect to each other.

The edge generator comprises a first bit detector detecting a most significant bit of the input signal; a second bit detector detecting a most significant bit of the input signal passing through the delayer; an exclusive OR calculator performing an exclusive-OR (XOR) operation on the detected values of the first bit detector and the second bit detector; a first edge signal generator using the output value of the exclusive OR calculator as a clock signal, and using the digital input signal as an input signal; and a second edge signal generator using the output value of the exclusive OR calculator as a clock signal simultaneously with the first edge signal generator, and using the digital input signal through the delayer as an input signal.

The above objects of the present invention are further achieved by providing a digital phase locked loop circuit comprising: a jitter signal generator having an edge detector generating first and second edge signals by discriminating a sign change from consecutive sampling points from a digitally converted input signal; a comparator outputting a signal having a smaller absolute value among the first and second edge signals output from the edge detector; an operating unit dividing an absolute value output from the comparator by the sum of the absolute value of the first edge signal and that of the second edge signal to obtain a jitter signal as a result, and a phase locked signal generator generating a phase locked signal, using a jitter signal generated from the jitter signal generator as a phase error signal.

BRIEF DESCRIPTION OF THE DRAWINGS

These and other objects and advantages of the present invention will become more apparent and more readily appreciated from the following description of the preferred embodiments thereof with reference to the attached drawings in which.

DESCRIPTION OF THE PREFERRED EMBODIMENTS

Figure 1:
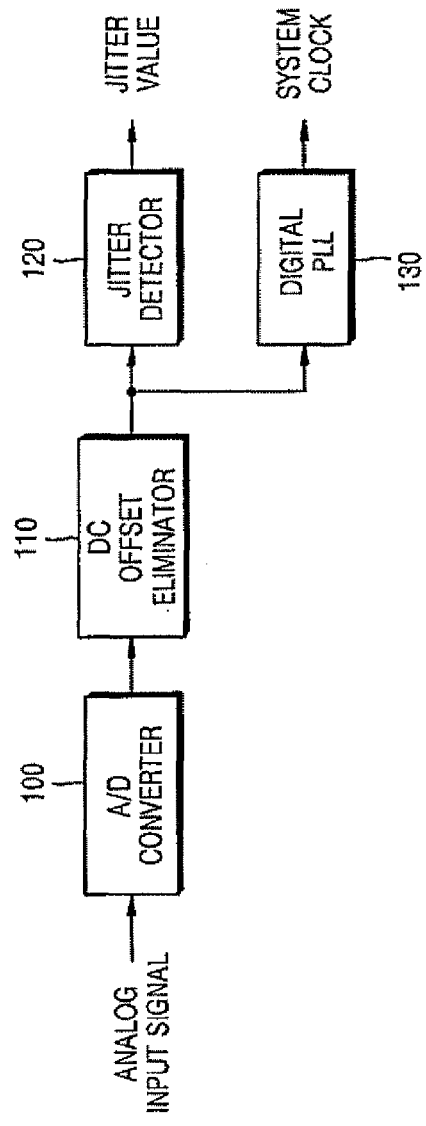
FIG. 1 is a block diagram of a general digital system including a jitter detecting circuit.

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2:
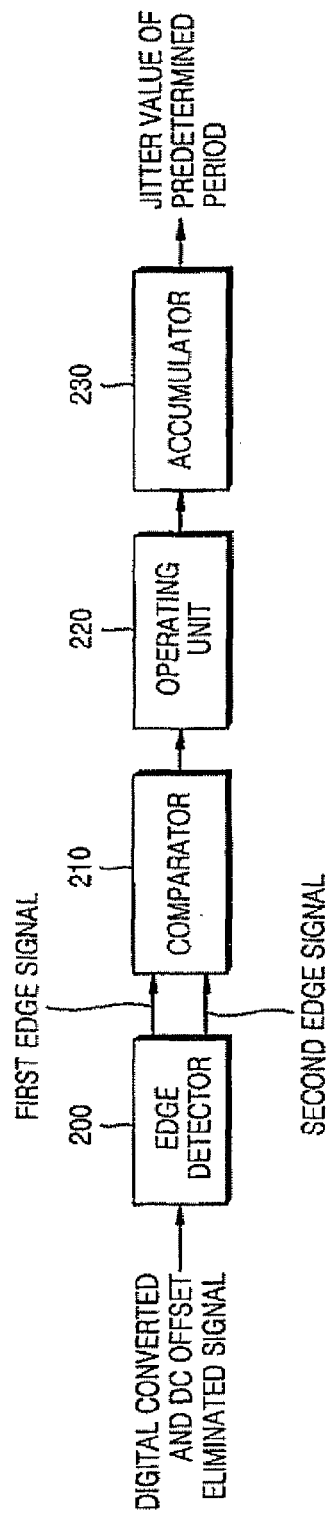
FIG. 2 is a block diagram of a jitter detecting circuit according to an embodiment of the present invention.

FIG. 2 is a block diagram of a jitter detecting circuit of the present invention, wherein the jitter detecting circuit includes an edge detector 200, a comparator 210, an operating unit 220, and an accumulator 230. The edge detector 200 discriminates whether the sign at two consecutive sampling points is changed from a digitally converted, DC offset removed input signal. If the sign is changed, a signal of the sampling point before the sign change and a signal after the sign change are output as the first and second edge signals respectively. The comparator 210 compares the first and second edge signals output from the edge detector 200, and outputs the signal having a smaller absolute value among the two signals. The operating unit 220 generates a jitter value which divides the smaller absolute value signal output from the comparator by the sum of the absolute values of the first edge signal and that of the second edge signal. This calculation uses a proportional formula of a triangle which will be described in detail hereinafter. The accumulator 230 accumulates the values output from the operating unit 220 during a predetermined period, and outputs the result as a jitter value of the predetermined period.

Figure 3:
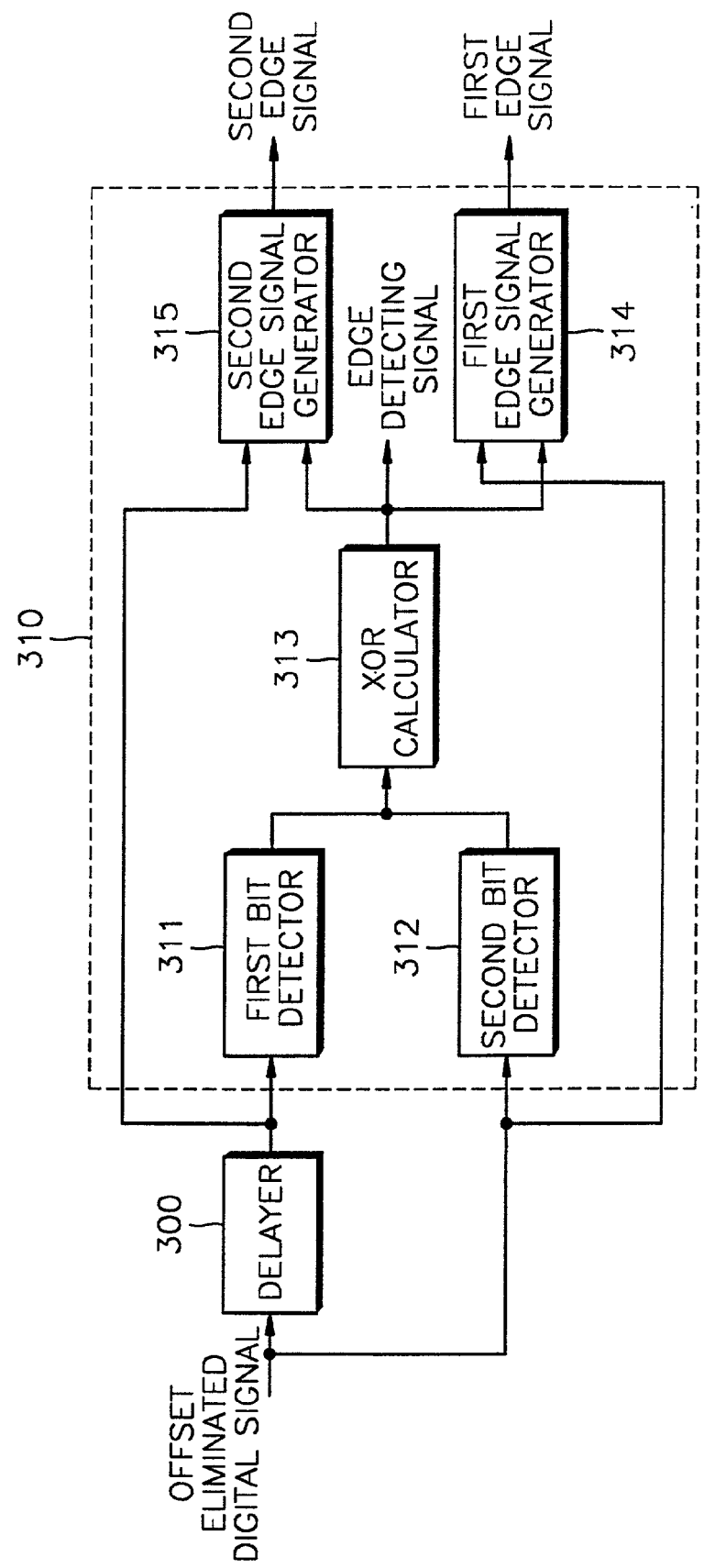
FIG. 3 is a detailed block diagram of an edge detector of FIG. 2.

FIG. 3 is a detailed block diagram of the edge detector 200 of FIG. 2 including a delayer 300 and an edge generator 310. The delayer 300 delays an (analog) input signal converted into a digital signal by one clock signal of the corresponding system clock. The edge generator 310 compares a sign of the original digital converted input signal with a sign of the digital converted input signal delayed by one clock signal from the delayer 300, and if the signs are different from each other, the two signals are both considered edge signals. Then, the original digital converted signal and the delayed signal through the delayer 300 are output as the first and second edge signals respectively. The edge generator 310 includes a first bit detector 311 detecting a first-input bit of a digital converted input signal delayed by one clock signal and a second bit detector 312 for detecting the next input bit from the digital converted input signal, wherein this concurrent detection of the first and the next sequential input bits is accomplished by using the delayer 300. The edge generator 310 further includes an exclusive OR (XOR) calculator 313 generating a 0 bit when the extracted values of the first bit detector 311 and the second bit detector 312 are the same, and generating a 1 bit when the extracted values are different; a first edge signal generator 314 using an output value of the exclusive OR calculator 313 as a clock, and using a digital input signal as an input signal, and a second edge signal generator 315 using the output value of the exclusive OR calculator 313 as a clock equally with the first edge signal generator 314, and using a delayed digital input signal from the delayer 310 as an input signal.

Figure 4:
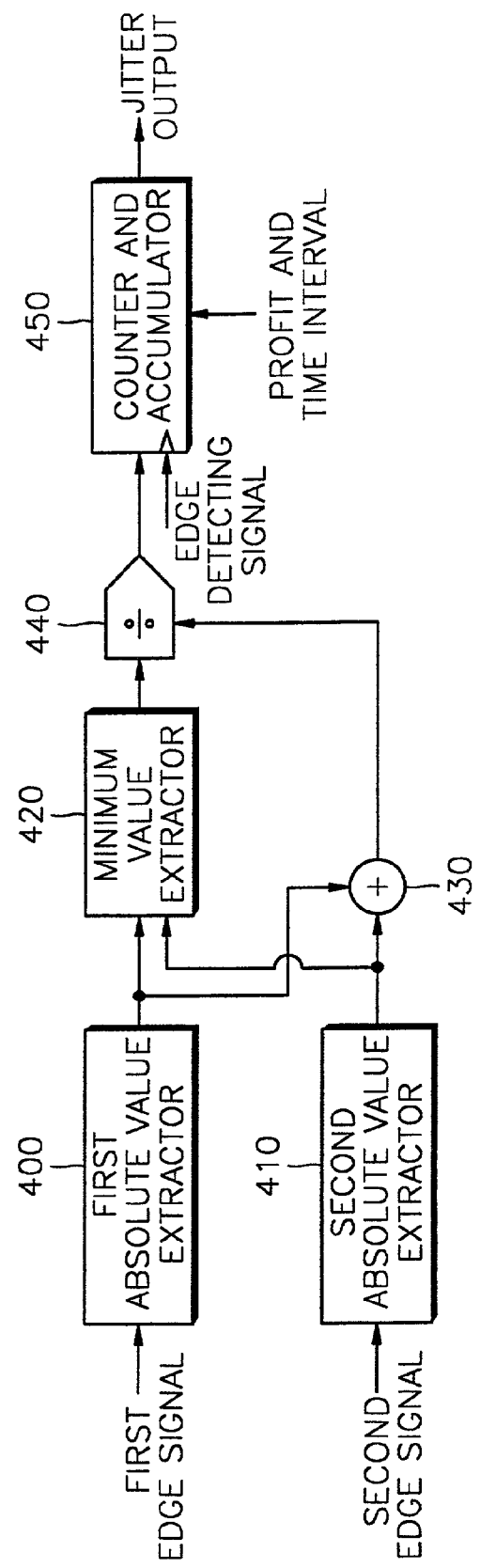
FIG. 4 is a detailed block diagram of a jitter calculator of FIG. 2.

In FIG. 2, the circuit excluding the edge detector 200 is called a jitter calculator which will be illustrated in greater detail in FIG. 4. FIG. 4 includes first and second absolute value extractors 400 and 410 detecting respective absolute values of the first and second edge signals extracted in FIG. 3; a minimum value extractor 420 detecting a smaller value among the first and second absolute values; an adder 430 adding the first and second absolute values; a divider 440 dividing a smaller absolute value generated from the minimum value extractor 420 by an output value generated from the adder 430; and a counter and an accumulator 450 accumulating jitter values calculated in the divider 440 whenever edges are generated, and generating the result as a jitter value of a predetermined period at every time interval. The counter and accumulator 450 can be set up in advance to generate a jitter value accumulated with a desired gain for a desired time interval received from a MICOM (not shown).

Hereinafter, the concept of jitter value calculation will be described.

Figure 5A:
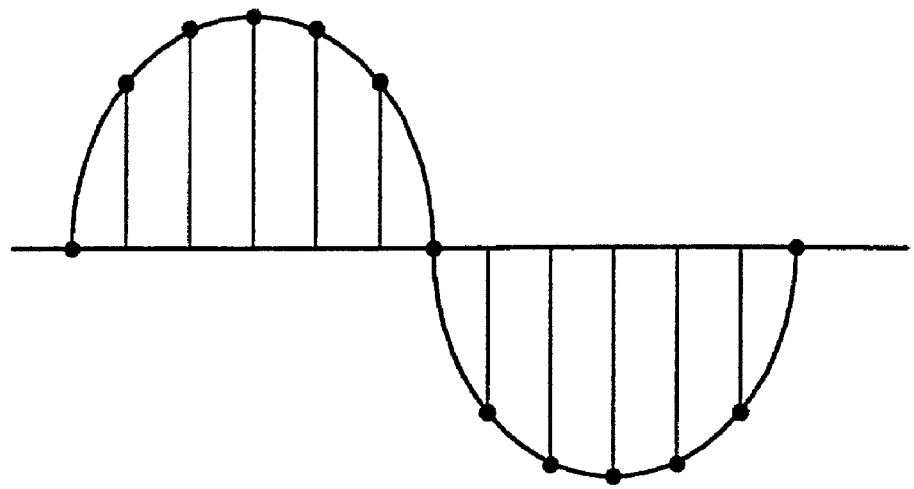
FIGS. 5A and 5B illustrate a signal without a jitter and a jitter generated signal, respectively.

Generally, in order to process signals from an optical disc, for example, a system clock is made from a PLL (Phase Locked Loop) circuit with an analog input signal, and then, data is processed using the system clock. Here, if the locked signal from the PLL circuit is synchronous with the analog input signal, the signal processing can be performed without a problem. However, if the locked signal from the PLL circuit is not synchronous with the input signal because noise is mixed or another undesirable thing happens in the input signal, it is a problem for processing a signal from the optical disc. In the latter case, the time difference between the system clock and a zero level of the input signal is called a jitter. FIG. 5A is an example of a signal without a jitter, and FIG. 5B is an example of a signal with a jitter.

Figure 5B:
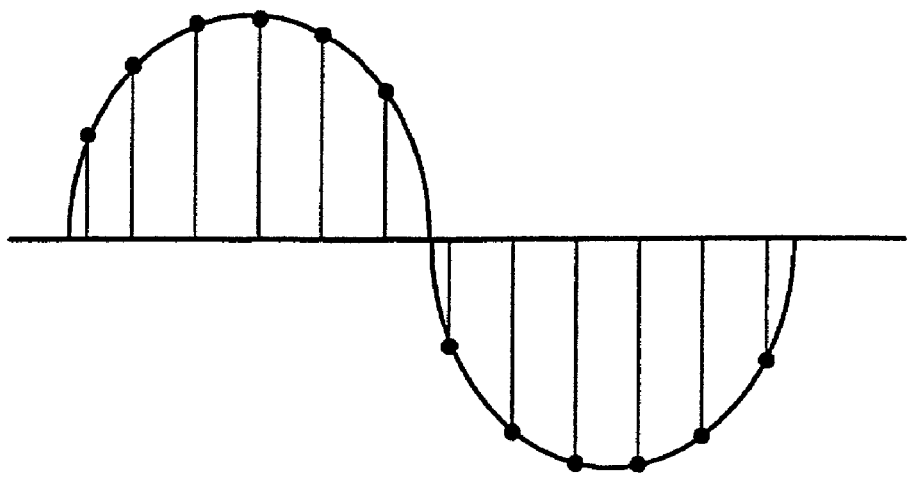
Figure 6:
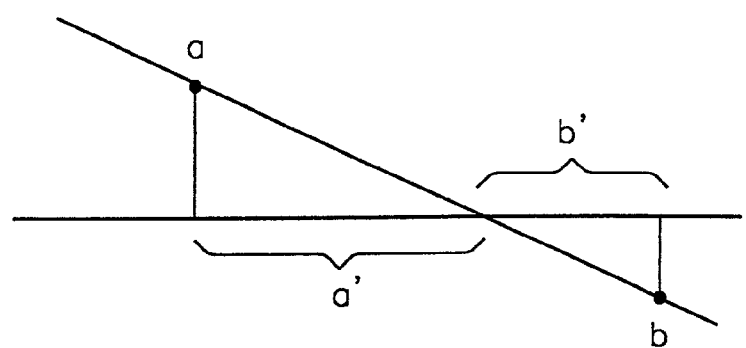
FIG. 6 magnifies and illustrates a signal around an edge of a jitter generated signal of FIG. 5b.

FIG. 6 magnifies and illustrates a part of a signal around the edge in a signal with the jitter shown in FIG. 5B. Letters "a" and "b" in FIG. 6 are amplitudes of a sampling signal which can be obtained by sampling an analog input signal. Also in FIG. 6, "a'" and "b'" are amounts of a phase delay at time coordinates, that is, a jitter, and one of the two having a smaller absolute value is chosen as a jitter value, so that in FIG. 6, b' is a jitter value. A sampling cycle is equal to a system clock cycle, so that b' added to a' equals a system clock. If a signal is linear in the edge generating portion, that is, around a zero cross point, the formula a:a'=b:b' can be derived according to a proportional formula of a triangle. Here, the value of "a", "b", and a system clock are given, so that b' is found from formula 1 below.

$$b' = b \times (\text{System clock}) / (a+b) \quad (1)$$

Accordingly, a jitter value calculation, using the formula 1, is not affected by an amplitude of an input signal, so that an accurate jitter value can be obtained. This is implemented on the operating unit 220 of FIG. 2.

Figure 7:
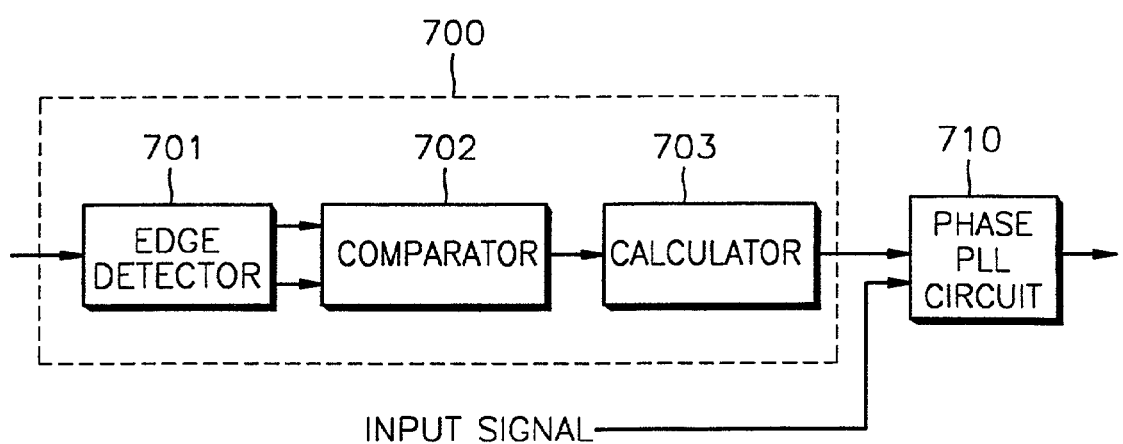
FIG. 7 illustrates a phase locked loop circuit using a jitter value as a phase error signal.

FIG. 7 illustrates a phase locked loop using a jitter value as a phase error signal, wherein the phase locked loop includes a jitter signal generator 700 and a PLL circuit 710. The jitter signal generator 700 includes an edge detector 701, a comparator 702, and an operating unit 703. The edge detector 701 discriminates signs of two consecutive signals from digital converted input signals, and if the signs are different from each other, the two signals are generated as first and second edge signals. The comparator 702 generates a signal having a smaller absolute value among the generated first and second edge values. The calculator 703 divides the smaller absolute value of the edge signal generated from the PLL circuit 710 by the sum of the absolute values of the first edge signal and that of the second edge signal to obtain a jitter value. A calculation principle of the calculator 703 is as described above with reference to FIG. 6. The PLL circuit 710 uses a jitter signal generated from the jitter signal generator 700 as a phase error signal to obtain a phase locked signal.

A jitter value can be suppressed to the maximum by a method optimizing a focus loop or tracking loop in a servo part of an optical disc using the present invention described above.

According to the present invention, a jitter amount is detected with signals derived from two sampling points around the edge from the analog-digital converted signal, so that an accurate jitter amount can be detected regardless of the input signal amplitude, and an accurate and fast phase locked signal can be obtained using the jitter value.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A jitter detecting circuit detecting a jitter value of a signal which is converted into a digital signal from an analog signal input, wherein the jitter detecting circuit comprises:
   an edge detector discriminating signs of two signals derived from consecutive sampling points from the digitally converted input signal, and outputting the two signals as first and second edge signals, respectively, if the signs are different from each other;
   a comparator outputting a signal having a smaller absolute value among the first and second edge signals output from the edge detector;
   an operating unit dividing the absolute value output from the comparator by a sum of the absolute value of the first edge signal and that of the second edge signal; and
   an accumulator accumulating outputs of the operating unit during a predetermined period, to obtain a jitter value of the predetermined period.

2. The jitter detecting circuit of claim 1, wherein the edge detector comprises:
   a delayer delaying the digitally converted input signal by one system clock; and
   an edge generator comparing signs of the delayed digitally converted input signal with signs of the digitally converted input signal, and outputting the two signals as the first edge signal and the second edge signal, respectively, if the signs are different with respect to each other.

3. The jitter detecting circuit of claim 2, wherein the edge generator comprises:
   a first bit detector detecting a most significant bit of the digitally converted input signal;
   a second bit detector detecting a most significant bit of the delayed digitally converted input signal;
   an exclusive OR calculator performing an exclusive-OR operation on the extracted most significant bits of the first bit detector and the second bit detector;
   a first edge signal generator using the output value of the exclusive OR calculator as a clock signal, and using the digitally converted input signal to generate the first edge signal; and
   a second edge signal generator using the output value of the exclusive OR calculator as the clock signal simultaneously with the first edge signal generator, and using the delayed digitally converted input signal, to generate the second edge signal.

4. A digital phase locked loop comprising:
   a jitter signal generator comprising:
      an edge detector generating first and second edge signals by discriminating sign changes from consecutive sampling points from a digital converted input signal,
      a comparator outputting a signal having a smaller absolute value among the first and second edge signals output from the edge detector, and
      an operating unit dividing the absolute value output from the comparator by a sum of the absolute value of the first edge signal and that of the second edge signal to obtain a jitter signal; and
   a phase locked signal generator generating a phase locked signal, using the jitter signal generated from the jitter signal generator as a phase error signal.

5. A method of detecting a jitter value comprising:
   converting an analog signal to a digital signal;
   checking consecutive sampling points from the digitally converted signal; and
   calculating the jitter value using the consecutive sampling points, wherein the calculating of the jitter value comprises:
      discriminating signs of two sampling points,
      obtaining first and second edge signals from the two sampling points if the signs are different, and
      dividing a smaller absolute value of the first edge signal and the second edge signal by a sum of an absolute value of the first edge signal and the second edge signal.

6. The method of claim 5, wherein the obtaining of the first and second edge signals comprises:
   delaying the digitally converted signal by one clock signal;
   comparing a sign of the digitally converted signal with a sign of the delayed digitally converted signal; and
   outputting the digitally converted signal and the delayed digitally converted signal as the first and second edge signals if the signs are different.

7. A method of providing a phase locked signal comprising:
   generating first and second edge signals by discriminating a sign change from consecutive sampling points from a digitally converted analog signal;
   outputting a signal having a smaller absolute value among the first and second edge signals generated;
   generating a jitter signal by dividing the smaller absolute value of the first edge signal and the second edge signal by a sum of the absolute value of the first edge signal and the second edge signal; and
   using the jitter signal as a phase error signal.

* * * * *